United States Patent
Patelmo et al.

(10) Patent No.: US 6,284,607 B1
(45) Date of Patent: Sep. 4, 2001

(54) METHOD OF MAKING HIGH-VOLTAGE HV TRANSISTORS WITH DRAIN EXTENSION IN A CMOS PROCESS OF THE DUAL GATE TYPE WITH SILICIDE

(75) Inventors: Matteo Patelmo, Bernareggio; Giovanna Dalla Libera, Monza; Nadia Galbiati, Seregno; Bruno Vajana, Bergamo, all of (IT)

(73) Assignee: STMicroelectronics S.R.L., Agrate Brianza (IT)

(*) Notice: Subject to any disclaimer, the term of this patent is extended or adjusted under 35 U.S.C. 154(b) by 0 days.

(21) Appl. No.: 09/411,134

(22) Filed: Oct. 1, 1999

(30) Foreign Application Priority Data

Oct. 2, 1998 (IT) .............................. MI98A2124

(51) Int. Cl.$^7$ .............................. H01L 21/8234
(52) U.S. Cl. .................... 438/275; 438/303; 438/305; 438/595; 438/200
(58) Field of Search .................... 438/275, 230, 438/213, 303, 305, 595, 218, 200, FOR 199; 257/500

(56) References Cited

U.S. PATENT DOCUMENTS 5,527,722 * 6/1996 Hutter et al. .
5,994,176 * 11/1999 Wu .
6,010,929 * 1/2000 Chapman .

* cited by examiner

Primary Examiner—George Fourson
Assistant Examiner—Michelle Estrada
(74) Attorney, Agent, or Firm—Theodore E. Galanthay; Robert Iannucci; Seed IP Law Group PLLC

(57) ABSTRACT

In a CMOS process for making dual gate transistors with silicide, high-voltage transistors with drain extensions are produced by first defining on a semiconductor substrate, active areas for low-voltage and high-voltage transistors. A gate oxide layer and a layer of polysilicon is deposited over the substrate, which is masked and etched to produce gates for the transistors. A dielectric layer is deposited to produce spacers to the sides of the transistor gate regions, then a mask partially shields the dielectric layer over the junctions of the high-voltage transistors while the spacers are being formed. Finally, the substrate is doped in the gate and active areas of the high-voltage transistor, and in the gate and active areas of the low-voltage transistor, except those areas that are blocked by the spacers.

13 Claims, 3 Drawing Sheets

METHOD OF MAKING HIGH-VOLTAGE HV TRANSISTORS WITH DRAIN EXTENSION IN A CMOS PROCESS OF THE DUAL GATE TYPE WITH SILICIDE

TECHNICAL FIELD

This invention relates to a method of making high-voltage HV transistors with drain extension in a CMOS process known as dual gate process with silicide.

BACKGROUND OF THE INVENTION

As is known in this specific technical field, there exists a growing demand for both fast logic circuits and non-volatile memories to be integrated in a single electronic device. Filling this demand considerably complicates the fabrication process of such integrated electronic devices because, as explained hereinafter, the technologies involved in the fabrication of these types of circuits are not fully compatible. This leads to increased production costs and makes it more difficult to achieve high production rates.

For example, the fabrication of high-voltage (HV) transistors, as are required for handling high voltages (>12V) at the programming stage of non-volatile memory cells, is complicated especially because it cannot be reconciled with the need to also provide low-voltage (LV) logic circuits with very fast MOS transistors.

In fact, high electric signal transmission speeds are usually achieved by using logic circuits comprised of transistors that have been subjected to a well-known silicidation process. This process consists essentially of metallizing with silicide, so to speak, the junctions of the transistors in the logic circuits, which is detrimental, however, to the junction breakdown performance.

This is at conflict with the need to provide high-voltage HV transistors having as a major characteristic thereof a higher resistance to breakdown.

In most fabrication processes with CMOS technology, the source and drain junctions of low-voltage MOS transistors are currently formed with a progressive profile by a double implantation of dopant known as LDD (Lightly Doped Drain).

Shown schematically in the attached FIG. 1, to an enlarged scale, is an exemplary structure of an N-channel MOS transistor 1 which has been formed by an LDD double implantation. A first implantation is lighter and allows a first region 3 to be formed self-aligned to the gate region 2; the second implantation is heavier and allows a second region 4 to be formed which is self-aligned to the so-called spacers 5 which isolate the gate region 2 laterally on opposite sides thereof. The spacers 5 are essentially dielectric material gussets located at the gate region 2 sides. Additionally to their isolation function, they allow the heavy junction implant to be spaced away from the gate edge.

The structure of a P-channel transistor is similar and easily obtained by substituting p-type regions for the n-type regions throughout, and vice versa.

The way high-voltage HV transistors are currently fabricated will now be described. A so-called drain extension technique is used for the purpose which yields lightly doped junctions and, therefore, a high breakdown value.

During the source and drain heavy implantation step for the low-voltage transistors, the HV transistors are fully masked off. The heavy implant only affects contact regions, to ensure good contacting.

As previously mentioned, the transistors of fast logic circuits go through a process step where the junctions are silicized, for less parasitic resistances and, hence, improved speed performance. The silicidation process becomes difficult where the underlying silicon is low-level doped, and accordingly does not suit the formation of HV transistors with drain extensions. Thus, it is obviously necessary to avoid silicidation of the drain extension junctions.

Latest generation processes usually provide for the transistors to be formed with gate regions doped with the same dopant type as the channel region, this feature being referred to as "dual gate". For this purpose, the gate region must be left unprotected during the heavy source and drain implantations.

This feature also implies that the gate regions of the HV transistors with drain extensions cannot be masked, not even partially so, from the heavy source and drain implantations.

A viable prior solution consisted of protecting the high-voltage transistor junctions with the dielectric utilized for defining the spacers, using an appropriate mask to prevent etching through certain regions.

However, this solution is complicated because it requires that the mask be not even partially covering any of the dual gate transistor gate regions, lest the polysilicon layer of the transistors is incorrectly implanted. If the gate region is not correctly implanted even at its sides, the threshold voltage of the affected transistor will not be the proper value.

SUMMARY OF THE INVENTION

Embodiments of this invention provide a novel method of forming high-voltage HV transistors with drain extension in a CMOS process of the dual gate type with silicide, thereby overcoming the drawbacks of prior art processes by modifying the differential spacer mask with respect to the process flow usually arranged for forming drain extension HV transistors.

The features and advantages of a method according to the invention will be more clearly understood from the following description of an embodiment thereof, given by way of non-limitative example with reference to the drawings.

DETAILED DESCRIPTION

The process steps and the structures described herein below do not portray the complete fabrication process for integrated circuits. Embodiments of the present invention can be practiced along with conventional integrated circuit fabrication techniques currently employed in the industry, and lengthy discussion of conventional steps has been omitted for brevity.

Figures showing cross-sections through portions of an integrated circuit during its fabrication are not scale drawings, and are primarily aimed at highlighting major features of the invention.

Figure 1:
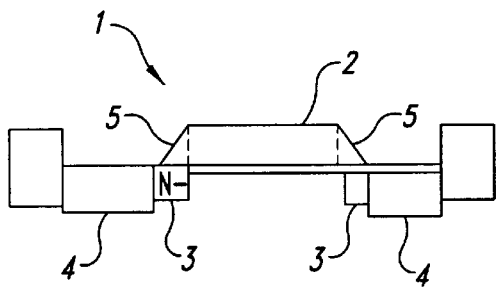
FIG. 1 is a cross sectional view of a low-voltage N-channel MOS transistor formed in accord with the prior art by an LDD implantation technique.
Figure 2:
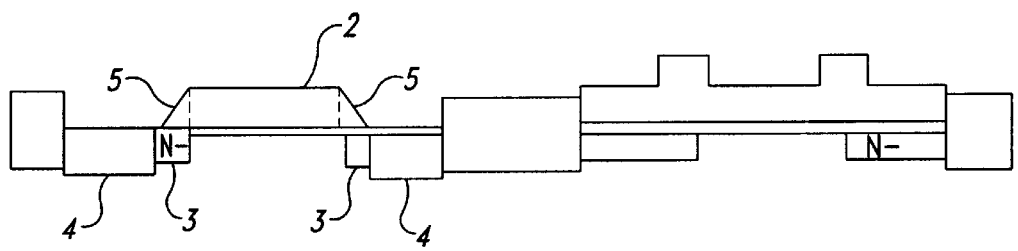
FIG. 2 is cross sectional view of a portion of a semiconductor-integrated circuit including a low-voltage transistor and a high-voltage transistor.
Figure 2A:
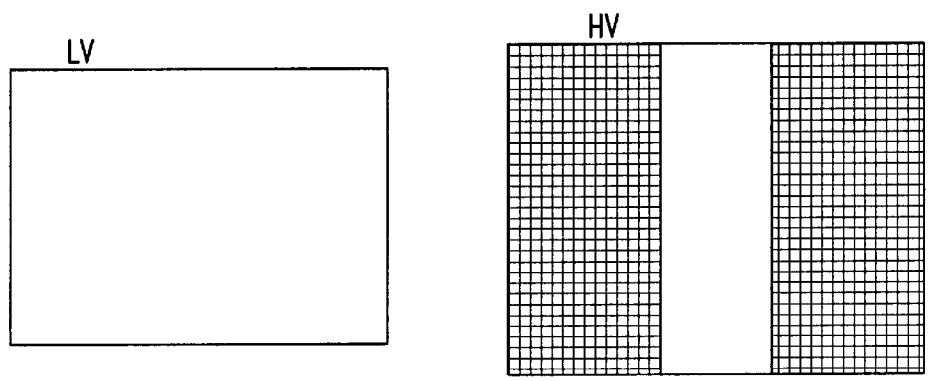
FIG. 2A is a view from above of the semiconductor portion shown in FIG. 2.
Figure 3:
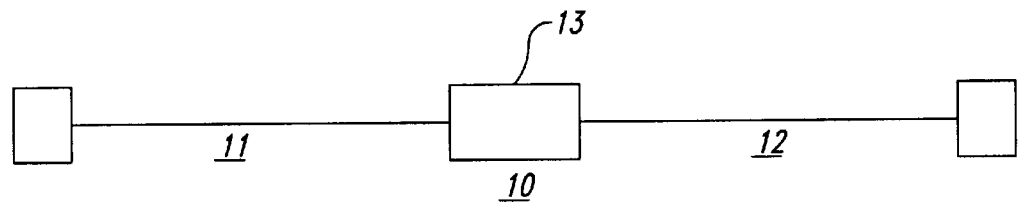
FIGS. 3, 4, 5 and 6 are respective cross-sectional views of an integrated circuit portion during successive steps of the method according to embodiments of the invention.
Figure 3A:
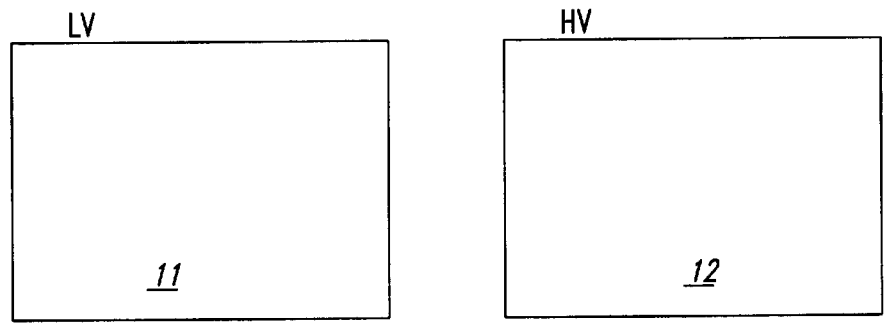
FIGS. 3A, 4A, 5A and 6A are views from above of the circuit portion shown in FIGS. 3, 4, 5 and 6, respectively.

Referring in particular to FIG. 3, some of the steps which result in high-voltage HV transistors with drain extension being formed in a CMOS process of the dual gate type with silicide will be described herein below.

The active areas of the several transistors are first defined on a semiconductor substrate 10. As shown in FIG. 3, for example, an active area 11 is defined for a low-voltage (LV) transistor, and another active area 12 is defined for a high-voltage (HV) transistor with drain extension. These active areas are separated from each other by an isolation region 13 of field oxide. Understandably, for each active area there corresponds a given transistor type.

Figure 4:
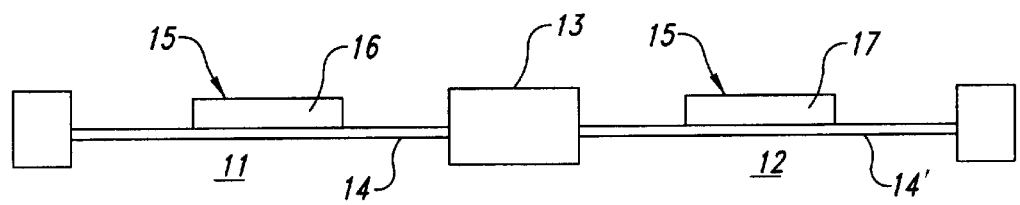
Figure 4A:
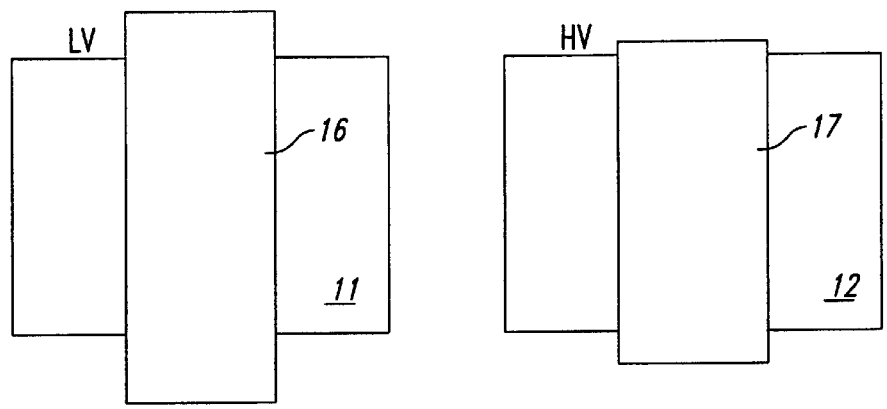

A thin layer 14 of gate oxide is deposited over the active areas 11 and 12. The thickness of the layer 14 is greater over the active area 12 intended for the HV transistor, as shown in FIG. 3. This is followed by a step of depositing a polysilicon layer 15 to form the gates of the transistors, both HV and LV. A first "poly" mask (not-shown) allows regions 16 and 17 to be respectively defined to form the transistor gates. The polysilicon layer at the sides of the LV and HV gate regions is then etched away, as shown in FIGS. 4 and 4A.

A subsequent masking step allows the p-type regions to be separated from the n-type regions in order to carry out a first light implantation, i.e. an implantation at a low dopant dosage, in the junction regions of the transistors.

Figure 5:
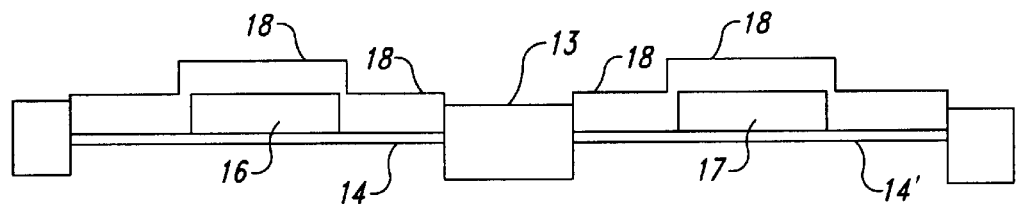
Figure 5A:
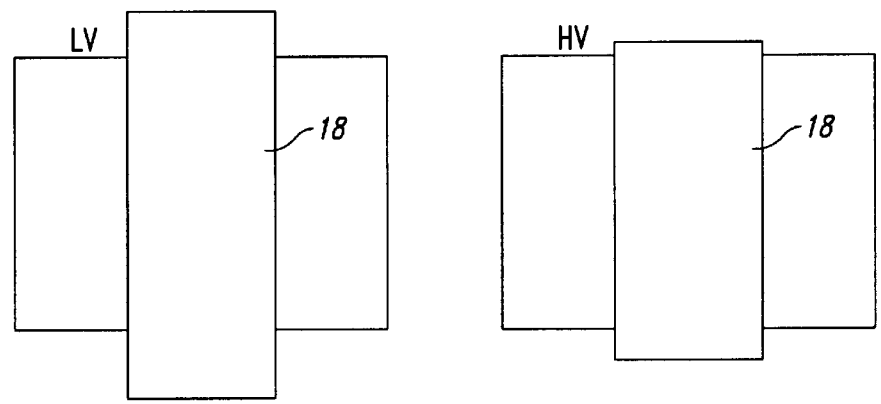

After this first implantation, a dielectric layer 18 is deposited conformably which represents the raw material for forming so-called spacers at the sides of the transistor gate regions. The dielectric layer 18 is shown in FIG. 5.

Advantageously in embodiments of this invention, a differential spacer mask 19 is used.

Figure 6:
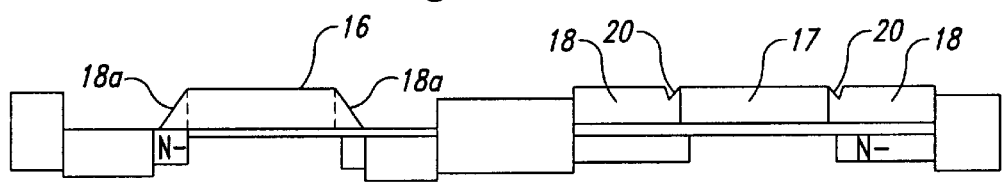

In essence, only the junctions of the high-voltage HV transistor are shielded from the dielectric etching directed to form the spacers, as shown in FIG. 6.

Figure 6A:
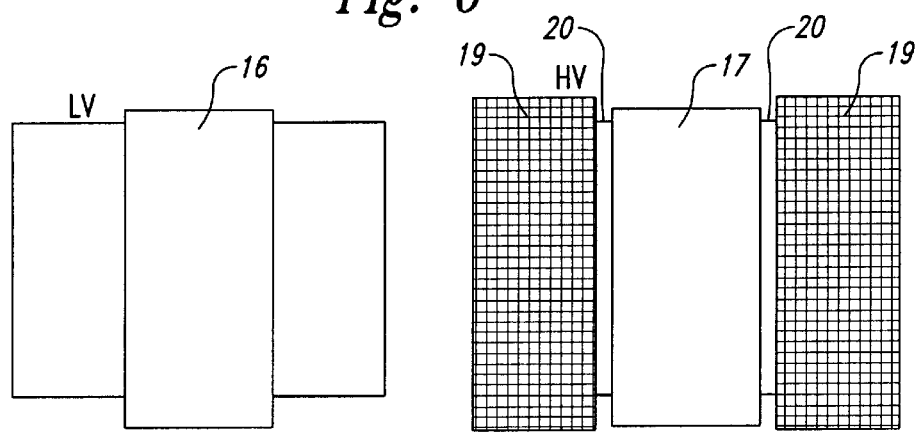

Advantageously, the mask 19 is so patterned as to later enable the dielectric to be thoroughly removed from above the gate regions of the HV transistors, as shown in FIG. 6A. This allows the gate regions to be also exposed to the subsequent heavy source and drain dopings. In addition, the doping is effected using dopant of the appropriate type, that is of the p type for p-channel transistors and of the n type for n-channel transistors.

At this point, embodiments of this invention use a spacer etching step using the mask 19. In this way, the spacers 18A are formed in the arranged zones for the LV transistor, whereas in the HV zones the dielectric 18 is left on top of all the junctions.

It is of interest that, in the region of the HV transistor which could have been affected by the spacer formation, an inceptive formation of such spacers is noticeable. Tests carried out at the Applicant's have revealed the presence of small ditches 20 in the layer 18, as shown in FIG. 6.

By appropriate calibration of the thicknesses of the dielectric 18 and the gate region, as well as of the spacing of the differential spacer mask 19 above the poly layer 14 of the gate, this inceptive formation of spacers can be kept small. There is no risk, therefore, of the junction being less than fully protected by the dielectric.

The fabrication process is then continued with second masks for separating the n zones from the p zones, and vice versa, and with associated heavy dopant implantations to form the source and drain junctions of the LDD type in the LV transistors and to dope the gate regions of these LV transistors.

In the HV zones, these implants only end at the poly layer 15 of the gate. In this way, n+ doped poly is obtained in the n zones, a p+ doped poly in the p zones, for both the low-voltage LV transistors and the high-voltage HV transistors, as provided for by the dual gate technique.

The steps of the inventive method are carried to completion conventionally by silicidizing the junctions and poly of the low-voltage transistor. The silicide does not form in the dielectric-containing zones.

This method has a major advantage in that it enables HV transistors with drain extension to be formed by a dual-gate CMOS process which also includes a step of silicidizing the junctions of the low-voltage transistors.

It should be further noted that with the method of this invention, it becomes possible to also correctly implant at the sides of the gate regions of the high-voltage transistors to achieve a correct threshold value for the transistors.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of making high-voltage HV transistors with drain extension in a CMOS process of the dual gate type with silicide, the method comprising:

defining, on a common semiconductor substrate, respective active areas for low-voltage transistors and high-voltage transistors, separated by isolation regions;

depositing a layer of gate oxide onto said active areas;

depositing a layer of polysilicon over the gate oxide layer;

first masking and then etching away the polysilicon layer to define respective gate regions of said low-voltage and high-voltage transistors;

conformably depositing a dielectric layer on the respective gate regions and on portions of the gate oxide layer positioned laterally of the respective gate regions;

using a differential spacer mask to partially shield the dielectric layer in areas over junctions of the high voltage transistors, the differential spacer mask having gaps over the low voltage transistors and over the gate regions of the high voltage transistors; and etching the dielectric layer through the gaps in the differential spacer mask, thereby removing portions of the dielectric layer over the gate regions of the low voltage transistors and the high voltage transistors.

2. The method of claim 1, further comprising doping the gate regions of the high voltage transistors through the differential spacer mask while protecting the junctions of the high voltage transistors with the differential spacer mask.

3. The method of claim 1, further comprising:

masking for separating p-type regions from n-type regions; and effecting a heavy implantation in the junctions of the low voltage transistors.

4. The method of claim 1, further comprising silicidizing the regions overlying the junctions and gates of the low-voltage transistors.

5. In a CMOS process, a method of forming high-voltage transistors comprising:

forming a first active area and a second active area in a semiconductor substrate;

forming an oxide layer over the substrate;

forming a polysilicon layer over the oxide layer;

selectively etching the polysilicon layer to form gates for a low-voltage transistor and a high-voltage transistor;

implanting junction regions of the low-voltage and high-voltage transistors in the semiconductor substrate with a first dosage implant;

forming a dielectric layer disposed over the semiconductor substrate;

placing a differential spacer mask over the substrate, the differential spacer mask covering the junction regions of the high-voltage transistor and having gaps over the gate of the high-voltage transistor and over the low-voltage transistor; and implanting the junction regions of the low-voltage transistor and the gate of the high-voltage transistor with a second dosage implant using the differential spacer mask to prevent the second dosage implant from entering the junction regions of the high-voltage transistor.

6. The method of claim 5 further comprising:

removing a portion of the dielectric layer disposed over the gate of the high-voltage transistor using the differential spacer mask as an etch mask.

7. The method of claim 5 further comprising forming spacers out of material from the dielectric layer, the spacers being adjacent to the gate of the low-voltage transistor.

8. The method of claim 5 further comprising silicidizing the gate and the junction regions of the low-voltage transistor.

9. The method of claim 5 wherein the junction regions of the low voltage transistor are formed in the first active area, the junction regions of the high-voltage transistor are formed the second active area, and wherein the first and second active areas are separated by a dielectric material.

10. The method of claim 5 wherein the oxide layer is thicker in areas covering the second active area than areas covering the first active area.

11. The method of claim 5 wherein the dosage level of the second dosage implant is higher than the dosage level of the first dosage implant.

12. The method of claim 1 wherein the gaps in the differential spacer mask extend over and beyond the gate regions of the high voltage transistors such that portions of the dielectric layer immediately adjacent to the gate regions of the high voltage transistors are uncovered by the differential spacer mask.

13. The method of claim 5 wherein the gap in the differential spacer mask over the gate region of the high-voltage transistor extends beyond the gate region of the high-voltage transistor such that portions of the dielectric layer immediately adjacent to the gate region of the high-voltage transistor are uncovered by the differential spacer mask.

* * * * *